(12) United States Patent
Yu et al.

(10) Patent No.: US 6,566,205 B1
(45) Date of Patent: May 20, 2003

(54) METHOD TO NEUTRALIZE FIXED CHARGES IN HIGH K DIELECTRIC

(75) Inventors: Mo-Chiun Yu, Taipei (TW); Chien-Hao Chen, Ilan (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 10/043,481

(22) Filed: Jan. 11, 2002

(51) Int. Cl.$^7$ .................. H01L 21/336; H01L 21/338; H01L 21/3205; H01L 21/4763
(52) U.S. Cl. .................. 438/287; 438/183; 438/591
(58) Field of Search .................. 438/287, 591, 438/183, 592, 770, 785, 787

(56) References Cited

U.S. PATENT DOCUMENTS

| | | | |
|---|---|---|---|
| 3,978,577 A | 9/1976 | Bhattacharyya et al. ...... 29/571 |
| 5,712,208 A | * 1/1998 | Tseng et al. ................. 438/287 |
| 5,856,690 A | * 1/1999 | Burns et al. ................. 257/315 |
| 5,908,312 A | * 6/1999 | Cheung et al. .............. 438/287 |
| 6,020,243 A | * 2/2000 | Wallace et al. .............. 438/287 |
| 6,048,769 A | 4/2000 | Chau .......................... 438/275 |
| 6,087,208 A | * 7/2000 | Krivokapic et al. ........ 438/287 |
| 6,110,784 A | * 8/2000 | Gardner et al. ............. 438/305 |
| 6,228,721 B1 | 5/2001 | Yu ............................... 438/275 |
| 6,251,729 B1 | 6/2001 | Montree et al. ............ 438/257 |
| 6,251,761 B1 | * 6/2001 | Rodder et al. .............. 438/287 |
| 6,255,204 B1 | * 7/2001 | Tobin et al. ................. 438/592 |
| 6,291,867 B1 | * 9/2001 | Wallace et al. ............. 257/310 |
| 6,380,056 B1 | * 4/2002 | Shue et al. ................. 438/287 |
| 6,380,104 B1 | * 4/2002 | Yu ............................... 438/787 |
| 6,444,592 B1 | * 9/2002 | Ballantine et al. .......... 438/770 |

* cited by examiner

Primary Examiner—John F. Niebling
Assistant Examiner—Walter L. Lindsay, Jr.
(74) Attorney, Agent, or Firm—George O. Saile; Stephen B. Ackerman

(57) ABSTRACT

To achieve a lower operating gate voltage for an FET, while avoiding breakdown and similar problems, a high K dielectric such as aluminum or zirconium oxide can be used As deposited, these materials tend to have a high density of trapped charge. The present invention discloses how such charge may be neutralized by impregnating the high K dielectric layer with between about 5 and 10 atomic percent of nitrogen. Several methods for introducing the nitrogen are described. These include diffusion from an overlay of silicon nitride, diffusion from a gas source, remote plasma nitridation, and decoupled plasma nitridation.

27 Claims, 3 Drawing Sheets

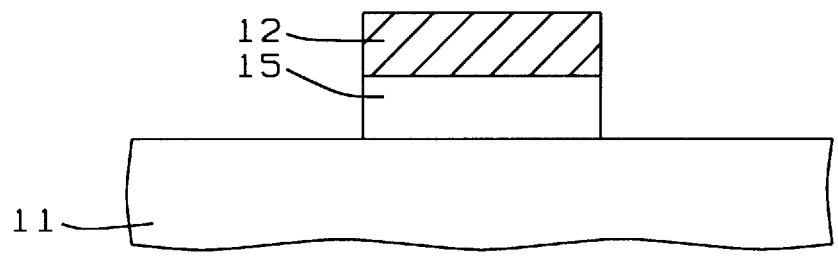
FIG. 1 - Prior Art
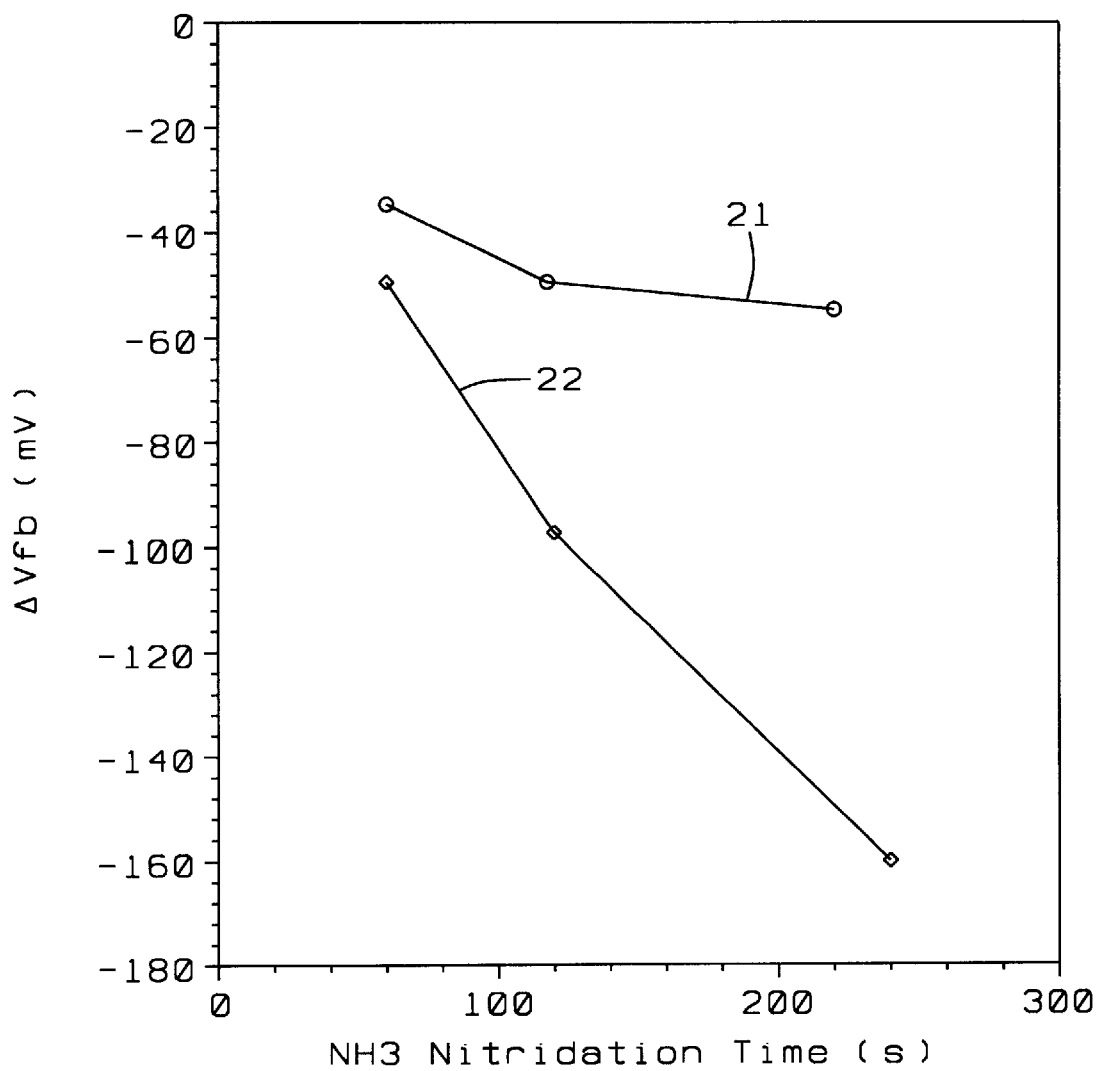
FIG. 2 - Prior Art

METHOD TO NEUTRALIZE FIXED CHARGES IN HIGH K DIELECTRIC

FIELD OF THE INVENTION

The invention relates to the general field of integrated circuits with particular reference to FET gates and methods to operate them at lower voltages.

BACKGROUND OF THE INVENTION

As part of the general development of integrated circuits there has been a steady drop in operating voltages. This has included a corresponding drop in the gate voltages used with Field Effect Transistor (FET) devices. FIG. 1 is a schematic illustration of an FET gate. Shown there is silicon substrate 11 on whose upper surface is a gate pedestal made up of silicon dioxide layer 15 and gate electrode 12. The above-mentioned reduction in gate voltage has meant that the thickness of the gate dielectric 15 has had to be similarly reduced. For traditional gate insulation made of silicon dioxide, this has meant gate dielectric thicknesses less about 15 Angstroms. When thicknesses get this low, dielectric leakage and premature breakdown become major problems.

To circumvent problems of this type, the FET art has begun using dielectrics having higher dielectric constants than silicon oxide. Since the charge density at the dielectric-silicon interface is proportional to the dielectric constant, thicker gate insulation can, in principle, then be used without otherwise affecting performance.

Among the dielectrics being considered as replacements for silicon oxide we include aluminum oxide and zirconium oxide. It has turned out that these materials, as normally deposited (e.g. by CVD (chemical vapor deposition)) result in devices with very poor high frequency performance whose cause has been identified as due to trapped charges in the dielectric.

The present invention describes how such charge can be permanently neutralized without introducing major changes into the overall device fabrication process. The principle on which the present invention is based is the observation that nitridation of a silicon oxide layer causes a shift of the flat band voltage to more negative values, as illustrated in FIG. 2 (where curve 21 is for NMOS devices and curve 22 is for PMOS devices). The flat band voltage is the minimum that is observed in a plot of capacitance as a function of voltage and the shift to more negative voltages is an indication that trapped positive charge has been introduced into the dielectric layer.

A routine search of the prior art was performed with the following references of interest being found:

In U.S. Pat. No. 6,251,761, Rodder et al. show a high K gate dielectric. A nitridation process is then used to convert the upper portion of the dielectric to a nitride. This is followed by an optional anneal. U.S. Pat. No. 3,978,577 (Bhattacharyya et al.) shows an Aluminum oxide gate dielectric. U.S. Pat. No. 6,251,729(Montree et al.) shows an aluminum oxide inter-gate dielectric while U.S. Pat. No. 6,048,769(Chau) and U.S. Pat. No. 6,228,721(Yu) show related processes.

SUMMARY OF THE INVENTION

It has been an object of at least one embodiment of the present invention to provide an FET gate capable of operating at low voltages and having a minimum of trapped charge in the dielectric portion.

Another object of at least one embodiment of the present invention has been to provide a process for manufacturing said FET gate.

Still another object of at least one embodiment of the present invention has been that said process be fully compatible with current semiconductor device manufacturing practices.

These objects have been achieved by employing a high K dielectric such as aluminum or zirconium oxide. As deposited, this layer has a high density of trapped charge which is then neutralized by impregnating it with between about 5 and 10 atomic percent of nitrogen. Several methods for introducing the nitrogen are described. These include diffusion from an overlay of silicon nitride, diffusion from a gas source, remote plasma nitridation, and decoupled plasma nitridation.

BRIEF DESCRIPTION OF THE DRAWINGS

FIG. 1 illustrates an FET gate structure of the prior art.

FIG. 2 is a plot of flat band voltage as a function of nitridation time.

DESCRIPTION OF THE PREFERRED EMBODIMENTS

As discussed above, earlier work has indicated that a nitridation process leads to the introduction of positive charge (nitrogen ions) into the dielectric. Based on indications that the poor performance of high K dielectrics was due to the presence of trapped negative charge (oxygen ions) an improvement in said performance as a result of nitridation could reasonably be anticipated. The present invention discloses several processes for the effective implementation of such nitridation.

In its most general form, the present invention teaches that, for dielectrics such as aluminum oxide, zirconium oxide, and zirconium doped aluminum oxide (between about 60 and 80 atomic percent zirconium) the introduction of between about 5 and 10 atomic percent of nitrogen into such a dielectric will reduce the areal density of trapped charge therein to less than about $10^{11}$ to $10^{12}$ c/cm$^2$.

Figure 3:
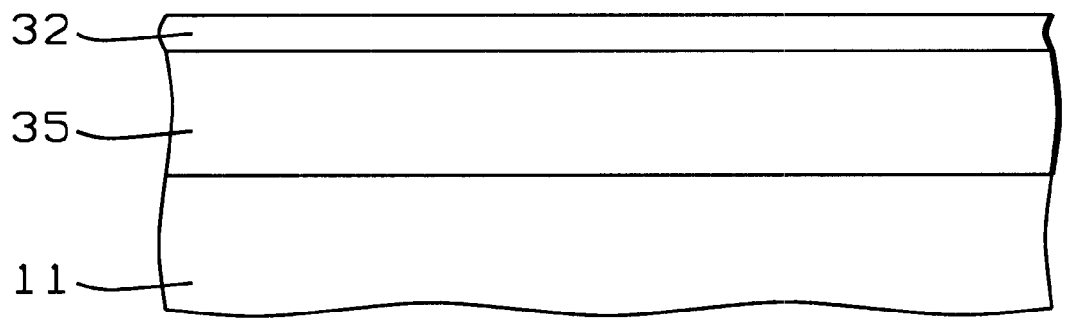
FIG. 3 illustrates the layers needed for one embodiment of the present invention.

We now describe several processes for the effective introduction of the nitrogen into these three (and other similar) dielectrics:

1$^{st}$ process: Beginning with silicon substrate 11, as seen in FIG. 3, high K dielectric layer 35 is first deposited to a thickness between about 50 and 100 Angstroms. This is followed by the deposition, to a thickness between about 5 and 20 Angstroms, of silicon nitride layer 32 onto high K dielectric layer 35. Next, the structure is subjected to a heat treatment whereby nitrogen ions from layer 32 diffuse into layer 35 where they serve to neutralize excess trapped negative charge. The heating process is performed at a temperature of between about 900 and 1,100° C. for between about 0.5 and 2 minutes in an atmosphere of nitrogen.

Figure 4:
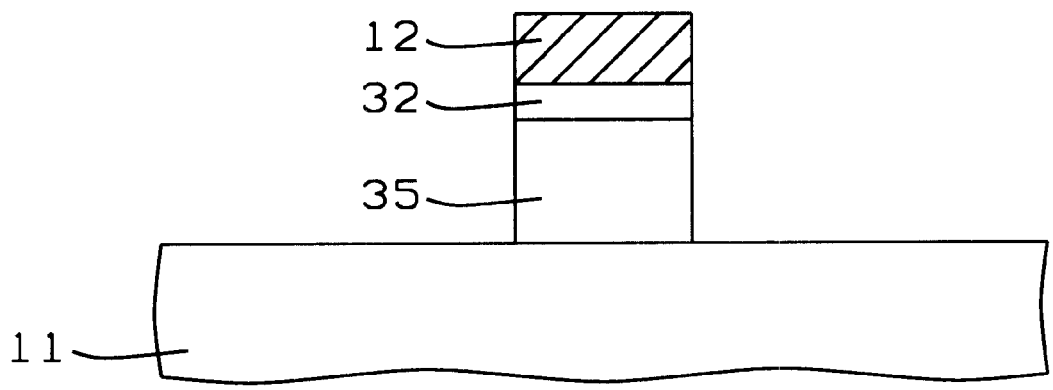
FIG. 4 shows an FET gate formed from the structure of FIG. 3.

Once the heat treatment has been completed, a layer of gate electrode material 12 is deposited onto silicon nitride layer 32 and, as seen in FIG. 4, layers 35, 32, and 12 are patterned and etched to form a gate structure. Possible materials for the gate electrode include polysilicon, titanium nitride, and aluminum, with polysilicon being preferred.

Figure 5:
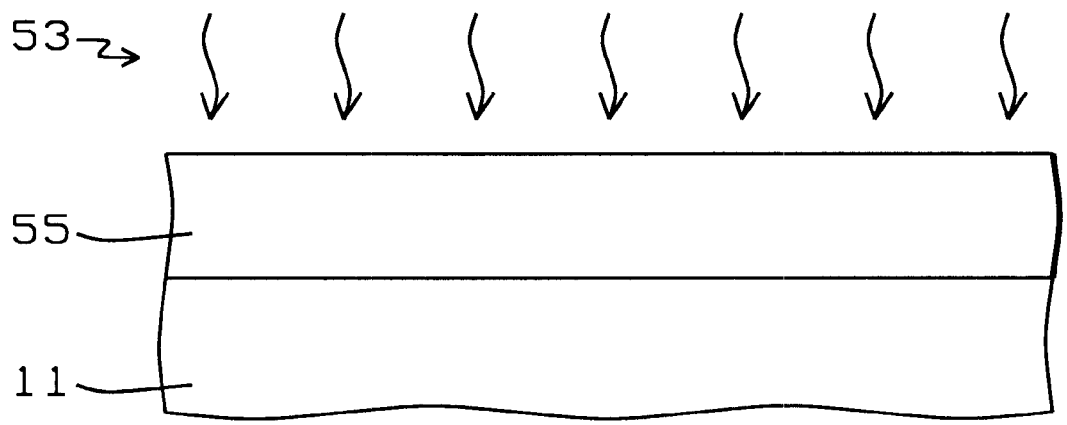
FIG. 5 schematically illustrates a nitridation process.
Figure 6:
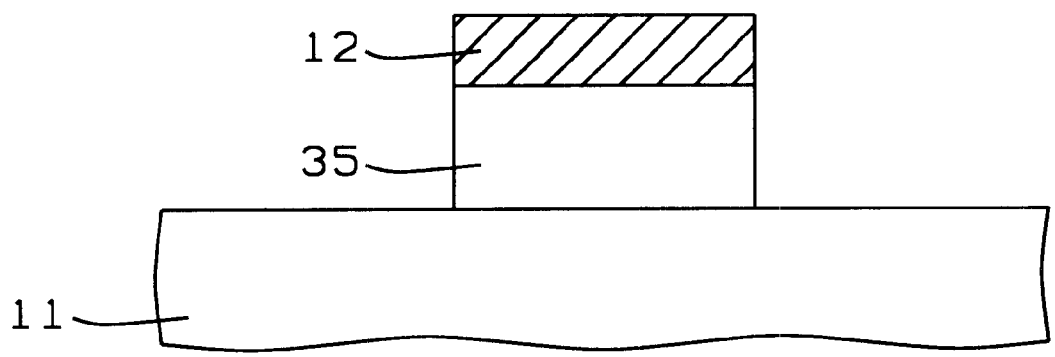
FIG. 6 illustrates an FET gate according to the teachings of the present invention.

$2^{nd}$ process: Beginning with silicon substrate 11, as seen in FIG. 5, high K dielectric layer 55 is first deposited to a thickness between about 50 and 100 Angstroms. This is followed by nitridation from the gas phase 53 (as opposed the solid phase used for the $1^{st}$ process). This results in impregnating the layer of high K dielectric with nitrogen to a concentration between about 5 and 10 atomic percent. Then a layer of gate electrode material 12 is deposited onto the nitrogen-impregnated layer 55, following which layers 12 and 55 are patterned and etched to form a gate structure as before.

Nitridation from the gas phase may be effected by any one of the following methods:

(i) By heating for between about 0.5 and 2 minutes at a temperature between about 900 and 1,000° C., optionally in an atmosphere of one or more of the following gases—ammonia, nitrous oxide, and nitric oxide.

(ii) By using remote plasma nitridation for between about 0.5 and 4 minutes at a temperature between about 400 and 1,000° C. in an atmosphere of one or more of the following gases—ammonia, nitrogen, nitrous oxide, and nitric oxide. Our preferred method of performing remote plasma nitridation has been at 550° C. for about 1 minute in nitrogen.

(iii) By using decoupled plasma nitridation for between about 0.1 and 2 minutes at a temperature between about 25 and 100° C. in an atmosphere of one or more of the following gases—ammonia, nitrogen, nitrous oxide, and nitric oxide. Our preferred method of performing decoupled plasma nitridation has been at 25° C. for about 30 seconds in nitrogen.

What is claimed is:

1. A dielectric layer having high dielectric constant and a low density of trapped charge, comprising:

between about 5 and 10 atomic percent of nitrogen in said dielectric layer, whereby said density of trapped charge is less than about $10^{11}$ to $10^{12}$ c/cm$^2$.

2. The dielectric layer described in claim 1 wherein said layer is selected from the group consisting of aluminum oxide, zirconium oxide, zirconium doped aluminum oxide, hafnium oxide, titanium oxide, and tantalum nitride.

3. A process for forming a gate structure for use in a field effect transistor, comprising:

providing a silicon body having a surface;

depositing a layer of aluminum oxide on said surface;

depositing a layer of silicon nitride on said layer of aluminum oxide;

then heating the aluminum oxide and silicon nitride layers whereby nitrogen ions diffuse into said layer of aluminum oxide;

then depositing a layer of gate electrode material on said layer of silicon nitride; and patterning and etching said layers of aluminum oxide, silicon nitride, and gate electrode material to form said gate structure.

4. The process described in claim 3 wherein said layer of aluminum oxide is deposited to a thickness between about 50 and 100 Angstroms.

5. The process described in claim 3 wherein said layer of silicon nitride is deposited to a thickness between about 5 and 20 Angstroms.

6. The process described in claim 3 wherein the step of heating the aluminum oxide and silicon nitride layers further comprises heating at a temperature of between about 900 and 1,100° C. for between about 0.5 and 2 minutes in an atmosphere of nitrogen.

7. The process described in claim 3 wherein said layer of gate electrode material is selected from the group consisting of polysilicon, titanium nitride, and aluminum.

8. A process for forming a gate structure for use in a field effect transistor, comprising:

providing a silicon body having a surface;

depositing a layer of zirconium oxide on said surface;

depositing a layer of silicon nitride on said layer of zirconium oxide;

then heating the zirconium oxide and silicon nitride layers whereby nitrogen ions diffuse into said layer of zirconium oxide;

then depositing a layer of gate electrode material on said layer of silicon nitride; and patterning and etching said layers of zirconium oxide, silicon nitride, and gate electrode material to form said gate structure.

9. The process described in claim 8 wherein said layer of zirconium oxide is deposited to a thickness between about 50 and 100 Angstroms.

10. The process described in claim 8 wherein said layer of silicon nitride is deposited to a thickness between about 5 and 20 Angstroms.

11. The process described in claim 8 wherein the step of heating the zirconium oxide and silicon nitride layers further comprises heating at a temperature of between about 900 and 1,100° C. for between about 0.5 and 2 minutes in an atmosphere of nitrogen.

12. The process described in claim 8 wherein said layer of gate electrode material is selected from the group consisting of polysilicon, titanium nitride, and aluminum.

13. A process for forming a gate structure for use in a field effect transistor, comprising:

providing a silicon body having a surface;

depositing a layer of zirconium doped aluminum oxide on said surface;

depositing a layer of silicon nitride on said layer of zirconium doped aluminum oxide;

heating the zirconium doped aluminum oxide and silicon nitride layers whereby nitrogen ions diffuse into said layer of zirconium doped aluminum oxide;

then depositing a layer of gate electrode material on said layer of silicon nitride; and patterning and etching said layers of zirconium doped aluminum oxide, silicon nitride, and gate electrode material to form said gate structure.

14. The process described in claim 13 wherein said layer of zirconium doped aluminum oxide is deposited to a thickness between about 50 and 100 Angstroms.

15. The process described in claim 13 wherein said layer of silicon nitride is deposited to a thickness between about 5 and 20 Angstroms.

16. The process described in claim 13 wherein the step of heating the zirconium doped aluminum oxide and silicon nitride layers further comprises heating at a temperature of between about 900 and 1,100° C. for between about 0.5 and 2 minutes in an atmosphere of nitrogen.

17. The process described in claim 13 wherein zirconium is present at a concentration between about 60 and 80 atomic percent.

18. A process for forming a gate structure for use in a field effect transistor, comprising:

providing a silicon body having a surface;

depositing a layer of aluminum oxide on said surface;

through a nitridation process, impregnating said layer of aluminum oxide with nitrogen to a concentration between about 5 and 10 atomic percent;

then depositing a layer of gate electrode material on said layer of aluminum oxide; and patterning and etching said layers of aluminum oxide and gate electrode material to form said gate structure.

19. The process described in claim 18 wherein said nitridation process further comprises remote plasma nitridation for between about 0.5 and 4 minutes at a temperature between about 400 and 1,000° C. in an atmosphere selected from the group consisting of ammonia, nitrogen, nitrous oxide, and nitric oxide.

20. The process described in claim 18 wherein said nitridation process further comprises decoupled plasma nitridation for between about 0.5 and 2 minutes at a temperature between about 25 and 100° C. in an atmosphere selected from the group consisting of ammonia, nitrogen, nitrous oxide, and nitric oxide.

21. A process for forming a gate structure for use in a field effect transistor, comprising:

providing a silicon body having a surface;

depositing a layer of zirconium doped aluminum oxide on said surface;

through a nitridation process, impregnating said layer of zirconium doped aluminum oxide with nitrogen to a concentration between about 5 and 10 atomic percent;

then depositing a layer of gate electrode material on said layer of zirconium doped aluminum oxide; and patterning and etching said layers of zirconium doped aluminum oxide and gate electrode material to form said gate structure.

22. The process described in claim 21 wherein said nitridation process further comprises remote plasma nitridation for between about 0.5 and 4 minutes at a temperature between about 400 and 1,000° C. in an atmosphere selected from the group consisting of ammonia, nitrogen, nitrous oxide, and nitric oxide.

23. The process described in claim 21 a wherein said nitridation process further comprises decoupled plasma nitridation for between about 0.5 and 2 minutes at a temperature between about 25 and 100° C. in an atmosphere selected from the group consisting of ammonia, nitrogen, nitrous oxide, and nitric oxide.

24. A process for forming a gate structure for use in a field effect transistor, comprising:

providing a silicon body having a surface;

depositing a layer of zirconium oxide on said surface;

through a nitridation process, impregnating said layer of zirconium oxide with nitrogen to a concentration between about 5 and 10 atomic percent;

then depositing a layer of gate electrode material on said layer of zirconium oxide; and patterning and etching said layers of zirconium oxide and gate electrode material to form said gate structure.

25. The process described in claim 24 wherein said nitridation process further comprises heating for between about 0.5 and 2 minutes at a temperature between about 900 and 1,000° C. in an atmosphere selected from the group consisting of ammonia, nitrous oxide, and nitric oxide.

26. The process described in claim 24 wherein said nitridation process further comprises remote plasma nitridation for between about 0.5 and 4 minutes at a temperature between about 400 and 1,000° C. in an atmosphere selected from the group consisting of ammonia, nitrogen, nitrous oxide, and nitric oxide.

27. The process described in claim 24, wherein said nitridation process further comprises decoupled plasma nitridation for between about 0.5 and 2 minutes at a temperature between about 25 and 100° C. in an atmosphere selected from the group consisting of ammonia, nitrogen, nitrous oxide, and nitric oxide.

* * * * *